(12) United States Patent
Nakano

(10) Patent No.: US 8,130,132 B2
(45) Date of Patent: Mar. 6, 2012

(54) DIFFERENTIAL CHOPPER COMPARATOR AND A/D CONVERTER INCLUDING THE SAME

(75) Inventor: Fumio Nakano, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 75 days.

(21) Appl. No.: 12/801,624

(22) Filed: Jun. 17, 2010

(65) Prior Publication Data

US 2011/0001649 A1 Jan. 6, 2011

(30) Foreign Application Priority Data

Jul. 3, 2009 (JP) .................................. 2009-158461

(51) Int. Cl.
*H03M 1/34* (2006.01)
(52) U.S. Cl. ............ 341/158; 341/155; 341/172; 330/69
(58) Field of Classification Search .................. 341/150, 341/158, 172
See application file for complete search history.

(56) References Cited

U.S. PATENT DOCUMENTS

| 4,450,368 | A  | * | 5/1984 | Spence | 327/89 |
| 6,677,880 | B2 | * | 1/2004 | Yamamoto | 341/169 |
| 7,394,309 | B1 | * | 7/2008 | Potanin et al. | 327/554 |

FOREIGN PATENT DOCUMENTS

JP 5-206756 A 8/1993

* cited by examiner

*Primary Examiner* — Khai M Nguyen
(74) *Attorney, Agent, or Firm* — McGinn IP Law Group, PLLC

(57) ABSTRACT

A differential chopper comparator compares an input signal voltage and a first voltage, and includes a first capacitor, a second capacitor, and a differential amplification unit including a differential amplification circuit. Either the input signal voltage or the first voltage is applied to one end of the first capacitor via a first switch unit. A fixed voltage is applied to one end of the second capacitor via a second switch unit. Either a non-inverting input terminal or an inverting input terminal of the differential amplification circuit is connected to the other end of the first capacitor, and the other terminal is connected to the other end of the second capacitor. An impedance of the first switch unit side viewed from one end of the first capacitor and an impedance of the second switch unit side viewed from one end of the second capacitor are substantially same.

17 Claims, 6 Drawing Sheets

DIFFERENTIAL CHOPPER COMPARATOR AND A/D CONVERTER INCLUDING THE SAME

INCORPORATION BY REFERENCE

This application is based upon and claims the benefit of priority from Japanese patent application No. 2009-158461, filed on Jul. 3, 2009, the disclosure of which is incorporated herein in its entirety by reference.

BACKGROUND

1. Field of the Invention

The present invention relates to a differential chopper comparator and an A/D converter including the same.

2. Description of Related Art

In recent years, high-speed and highly accurate A/D converter (Analog to Digital Converter) is used for video signal processing or the like. A differential chopper comparator is known as a comparator provided in this kind of the A/D converter. This differential chopper comparator is mostly composed of CMOS transistors, and is mounted to ASIC, for example.

An example of such differential chopper comparator is disclosed in Japanese Unexamined Patent Application Publication No. 5-206756. FIG. 4 is a part of FIG. 14 of Japanese Unexamined Patent Application Publication No. 5-206756. FIG. 5 illustrates control signals Φ11 and Φ13 supplied to the differential chopper comparator.

The configuration of the differential chopper comparator of a related art illustrated in FIG. 4 is described hereinafter. A switch SW11 is provided between an input terminal I11 supplied with an input signal voltage Vin and one end of a capacitor C11. Further, a switch SW12 is provided between an input terminal I12 supplied with a reference voltage Vref and one end of the capacitor C11. Switches SW13 and SW14 are provided in parallel between the input terminal I12 and one end of a capacitor C12. The capacitors C11 and C12 hold electrical charges when the input signal voltage Vin and the reference voltage Vref, which are respectively supplied to the capacitors C11 and C12, are connected to the capacitors C11 and C12. The capacitors C11 and C12 are referred to as sampling capacitors in this document.

Then, the other ends of the capacitors C11 and C12 are respectively connected to a positive phase input terminal and a negative phase input terminal of a differential amplification circuit 50. One end of the differential output of the differential amplification circuit 50 is connected to the other end of the capacitor C11 via the switch SW16. The other end of the differential output of the differential amplification circuit 50 is connected to the other end of the capacitor C12 via the switch SW17.

The control signal Φ11 controls the switches SW11, SW14, SW16, and SW17 to turn on and off. Further, the control signal Φ13 controls the switches SW12 and SW13 to turn on and off. As illustrated in FIG. 5, the control signals Φ1 and Φ13 have pulse widths of constant cycles, and the phases of the control signals Φ11 and Φ13 are opposite.

As described above, the differential chopper comparator of FIG. 4 is provided with the switches S11, S12, S16, and the switches S13, S14 and S17. The differential chopper comparator cancels out the influence of the switching noise (feedthrough) generated from the switches S11, S12, S13, S14, S16, and S17 at the time of switching between the sample operation (reset operation) and the hold operation (comparison operation).

SUMMARY

In order to explain the problem to be solved by the present invention, a sample hold circuit 31 illustrated in FIG. 6 is used to examine the feedthrough in the differential chopper comparator according to a related art.

The sample hold circuit 31 of FIG. 6 is composed of an N-channel MOS transistor M35, which is commonly used in a CMOS circuit as a switch, and a capacitor C36 for holding electric charge. An analog input power supply 32 (with an input signal voltage Vin) is connected to the sample hold circuit 31 as an input signal via an impedance Zi (33). The impedance Zi (33) is placed between a terminal 34, which is one end of the switch M35, and the analog input power supply 32. Note that a control signal Φ30 controls a switch M35 to turn on and off.

In the sample operation, the control signal Φ30 of H level (VH) is supplied to a gate of the switch M35. In the hold operation, the control signal Φ30 of L level is supplied to the gate of the switch M35. Then, in the sample operation, the sample hold circuit 31 turns on the switch M35 and samples the input signal voltage Vin. In the hold operation, the sample hold circuit 31 turns off the switch M35 and holds electric charge in the capacitor C36. In the hold operation, as the switch M35 is an NMOS transistor, the electric charge of Cgs×VH is injected into a parasitic capacitance Cgs between a gate and a source terminals of the switch M31.

When the switch M35 changes from on to off, the gate level of the switch M35 becomes zero. Thus the electric charge accumulated in the parasitic capacitance Cgs is injected in the capacitor C36. This is called feedthrough. However, some electric charge accumulated in the parasitic capacitance Cgs escapes into the analog input power supply 32 via the switch M35 as the actual waveform of the control signal Φ30 has a certain slope and because of the response speed of the switch M35, meaning that there is transition time for the switch M35 to completely turn off from low on-resistance state.

The amount of electric charge escaping into the analog input power supply 32 depends on the signal waveform of the control signal Φ30 that controls the switch M35, the transitional on-resistance of the switch M35, the impedance Zi between the analog input power supply 32 and the terminal 34, and the capacitor C36 for holding electric charge.

The smaller the on-resistance of the switch and the impedance assuming the analog input power supply 32 are, the more electric charge by the feedthrough escapes. In order for the feedthrough to escape, the size of the switch should be increased and the on-resistance of the switch should be reduced. However, the parasitic capacitance Cgs also increases in proportion to the increase in the switch size, thereby increasing the feedthrough. Therefore, changing the size of the switch M35 does not reduce the feedthrough. Further, as the impedance assuming the analog input power supply 32 is limited, all the electric charge by the feedthrough cannot escape, and the remaining electric charge causes a sampling error.

This phenomenon is considered with the differential chopper comparator of the related art illustrated in FIG. 4. The impedance of the differential chopper comparator of the related art illustrated in FIG. 4 in the sample operation will be as described below by the circuit configuration.

As illustrated in FIG. 5, in the sample operation, a control signal Φ11 is high level and Φ13 is low level. Accordingly, the switches SW11, SW14, SW16, and SW17 turn on, and SW12 and SW13 turn off.

The impedance in the sample operation viewed from the capacitor C11 is a sum of the impedance of the positive phase input terminal side of the differential amplification circuit 50 viewed from the capacitor C11, and the impedance of the switches SW11 and SW12 side viewed from the capacitor C11 when the switches SW11 and SW16 are on and SW12 is off.

Similarly, the impedance in the sample operation viewed from the capacitor C12 is a sum of the impedance of the negative phase input terminal side of the differential amplification circuit 50 viewed from the capacitor C12, and the impedance of the switches SW13 and SW14 side viewed from the capacitor C12 when the switches SW14 and SW17 are on and SW12 and SW13 are off.

As in the differential chopper comparator illustrated in FIG. 4, even if the switches SW11, SW12, and SW16, and the switches SW13, SW14, and SW17 are provided to configure symmetrically relative to the positive and negative phase input terminals of the differential amplification circuit 50, the impedance in the sample operation viewed from the capacitor C12 is different from the impedance in the sample operation viewed from the capacitor C11 by at least the amount of load capacitance of the terminals of the switches SW12 and SW13. (There is actually a difference in the impedance values due to the influence of the inductance of wires, for example)

This indicates that when shifting from the sample operation to the hold operation, the impedance of the input side viewed from the capacitor C11 is different from the impedance of the input side viewed from the capacitor C12 in the sample operation. Therefore, when shifting from the sample operation to the hold operation, the amount of electric charge escaping from the switch SW11 is different from the amount of electric charge escaping from the switch SW14. Accordingly, the amount of feedthrough of the capacitor C11 side is different from the amount of feedthrough of the capacitor C12 side. Thus the feedthroughs cannot be completely cancelled out by the differential chopper comparator of the related art illustrated in FIG. 4.

In sum, in the differential chopper comparator of the related art, the amount of feedthrough from each switch provided to the respective capacitors C11 and C12 is different, thus the feedthroughs cannot be cancelled out. The present inventor has found a problem that the differential chopper comparator of the related art cannot output a highly accurate comparison result.

An exemplary aspect of the present invention is a differential chopper comparator for comparing an input signal voltage and a first voltage that includes a first capacitor, a second capacitor, and a differential amplification unit including a differential amplification circuit. One of the input signal voltage and the first voltage is applied to one end of the first capacitor via a first switch unit. A second voltage is applied to one end of the second capacitor via a second switch unit. One of a non-inverting input terminal and an inverting input terminal of the differential amplification circuit is connected to the other end of the first capacitor, and the other one of the non-inverting input terminal and the inverting input terminal is connected to the other end of the second capacitor. Further, an impedance of the first switch unit side viewed from the one end of the first capacitor and an impedance of the second switch unit side viewed from the one end of the second capacitor are substantially same.

The abovementioned circuit configuration can output a highly accurate comparison result.

The present invention can provide a differential chopper comparator that can output a highly accurate comparison result and an A/D converter including the same.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
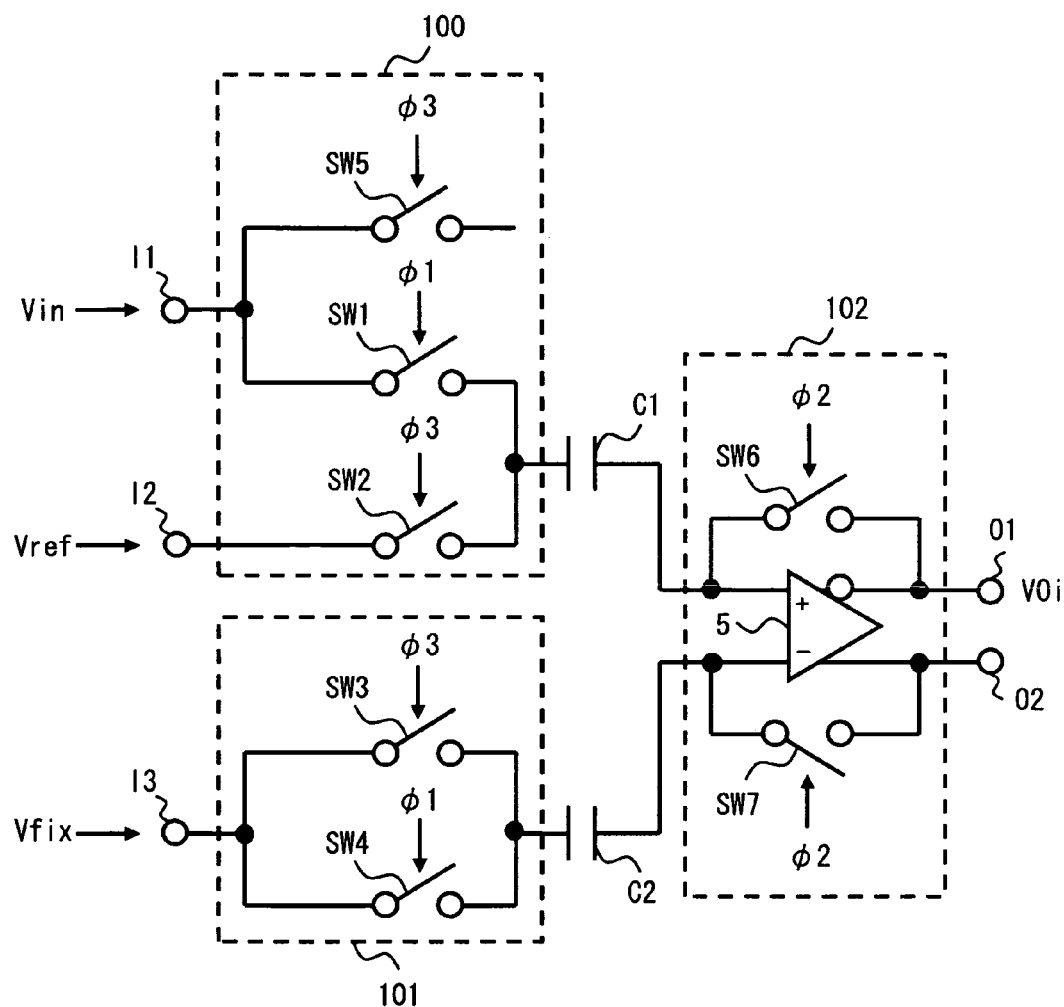
FIG. 1 is a circuit diagram of a differential chopper comparator according to an exemplary embodiment of the present invention.

A specific exemplary embodiment incorporating the present invention is described hereinafter with reference to the drawings. In the drawings, same components are marked with the same reference numerals, and duplicated explanation is omitted as appropriate.

First Exemplary Embodiment

A first exemplary embodiment of the present invention is explained with reference to the drawings. FIG. 1 illustrates a differential chopper comparator according to a first exemplary embodiment of the present invention. The circuit illustrated in FIG. 1 is provided with switches SW1 to SW7 (a first to seventh switches), capacitors C1 and C2 (the capacitor C1 is a first capacitor and the capacitor C2 is a second capacitor), and a differential amplification circuit 5. Note that the switches SW1, SW2, and SW5 form a first switch unit 100. The switches SW3 and SW4 form a second switch unit 101. The differential amplification circuit 5, and the switches SW6 and SW7 form a differential amplification unit 102.

The switches SW1 and SW4 are sampling switches, SW6 and SW7 are feedback switches of the differential amplification circuit 5, and the capacitors C1 and C2 are so-called sampling capacitors. Both the capacitors C1 and C2 include at least two terminals, and a capacitance between the two terminals. In this document, one terminal of the two terminals is referred to as one end of the capacitor, and the other terminal is referred to as the other end of the capacitor. Similarly, the switches SW1 to SW7 include at least three terminals and switch the two terminals among the three terminals between conductive and non-conductive state. In this document, one terminal of the two terminals is referred to as one end of the switch, and the other terminal is referred to as the other end of the switch. At least one remaining terminal is a control terminal for turning on and off the switches.

The differential chopper comparator of this exemplary embodiment includes an input terminal I1 (a first terminal), an input terminal I2 (a second terminal), and an input terminal I3 (a third terminal). Input signals, such as an analog signal, are input to the input terminal I1. That is, a voltage (input signal voltage Vin) of the input signal is applied to the input terminal I1. Further, a reference voltage (Vref) is applied to the input terminal I2. A predetermined fixed voltage Vfix is applied to the input terminal I3. The input signal voltage (Vin) shall be a first voltage, the reference voltage (Vref) shall be a second voltage, and the fixed voltage (Vfix) shall be a third voltage.

Furthermore, both the reference voltage (Vref) and the fixed voltage (Vfix) are voltages of fixed levels. Moreover, the reference voltage (Vref) is compared with the input signal voltage (Vin). The fixed voltage (Vfix) is used to obtain the amount of feedthrough to be compensated. The details are described later.

Note that the fixed voltage Vfix and the reference voltage Vref are applied to the input terminals I2 and I3, so as to maintain the state in which the input terminals I2 and I3 are separated to the extent not to electrically influence each other. It is desirable that the fixed voltage Vfix and the reference voltage Vref are generated by different power supplies. The voltage levels of the fixed voltage Vfix and the reference voltage Vref may be the same.

The differential chopper comparator of this exemplary embodiment includes output terminals O1 and O2. The output terminals O1 and O2 are respectively connected to an inverting output terminal and an non-inverting output terminal of the differential amplification circuit 5, which is described later.

As for the capacitor C1, one end is connected to the first switch unit 100, and the other end is connected to the differential amplification unit 102. As for the capacitor C2, one end is connected to the second switch unit 101, and the other end is connected to the differential amplification unit 102.

The switch SW1 is provided between the input terminal I1 applied with the input signal voltage Vin and one end of the capacitor C1. The switch SW2 is provided between the input terminal I2 applied with the reference voltage Vref (the first voltage) and one end of the capacitor C1. Accordingly, the switches SW1 and SW2 are electrically connected via one end of the capacitor C1.

One end of the switch SW5 is connected to the input terminal I1. The impedance of the switch SW5 is equivalent to that of the switch SW3, which is described later. The switch SW5 is a replica element of the switch SW3. Accordingly, this replica element is not limited to a switch (switching element).

Both the switches SW3 and SW4, which form the second switch unit 101, are provided in parallel between the input terminal I3 applied with the fixed voltage Vfix (the second voltage) and one end of the capacitor C2.

The differential amplification circuit 5 includes a non-inverting input terminal, an inverting input terminal, a non-inverting output terminal, and an inverting output terminal. In this exemplary embodiment, the non-inverting input terminal of the differential amplification circuit 5 is connected to the other end of the capacitor C1. Further, the inverting input terminal is connected to the other end of the capacitor C2.

Moreover, the switch SW6 is provided between the non-inverting input terminal and the inverting output terminal of the differential amplification circuit 5. The switch SW7 is provided between the inverting input terminal and the non-inverting output terminal of the differential amplification circuit 5.

Figure 2:
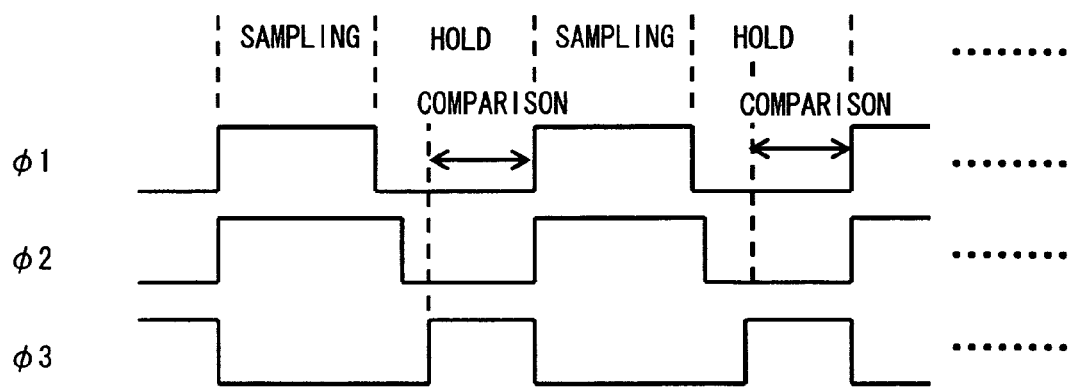
FIG. 2 is a waveform chart of control signals for controlling each switch of the differential chopper comparator according to the exemplary embodiment of the present invention.

Control signals ($\Phi 1$, $\Phi 2$, and $\Phi 3$) illustrated in FIG. 2 control the differential chopper comparator of this exemplary embodiment to turn on and off. The control signals ($\Phi 1$, $\Phi 2$, and $\Phi 3$) control the switches SW1 to SW7 to turn on and off. To be more specific, the switches SW1 and SW4 are controlled to turn on and off by the control signal $\Phi 1$ (a first control signal). The switches SW6 and SW7 are controlled to turn on and off by the control signal $\Phi 2$ (a second control signal). The switches SW2, SW3, and SW5 are controlled to turn on and off by the control signal $\Phi 3$ (a third control signal).

Note that this exemplary embodiment illustrated in FIG. 1 is an example in which the switches SW1 to SW7 are N-channel MOS transistors (NMOS). However, the switches SW1 to SW7 may be P-channel MOS transistors (PMOS) or transfer gates combining PMOS and NMOS.

Next, the operation of the differential chopper comparator of this exemplary embodiment is explained. As described above, the control signals ($\Phi 1$, $\Phi 2$, and $\Phi 3$) illustrated in FIG. 2 are applied to the switches SW1 to SW7, in the differential chopper comparator of this exemplary embodiment. Then, the switches SW1 to SW7 turn on and off according to the control signals ($\Phi 1$, $\Phi 2$, and $\Phi 3$). As illustrated in FIG. 2, the control signals ($\Phi 1$, $\Phi 2$, and $\Phi 3$) are pulse signals having pulse widths of constant cycles.

The switches SW1 to SW7 of the differential chopper comparator in this exemplary embodiment are formed of NMOS transistors. Thus, if the control signals $\Phi 1$ and $\Phi 2$ are H level and the control signal $\Phi 3$ is L level, the switches SW1, SW4, SW6, and SW7 turn on and the switches SW2, SW3, and SW5 turn off. On the other hand, if the control signals $\Phi 1$ and $\Phi 2$ are L level and the control signal $\Phi 3$ is H level, the switches SW1, SW4, SW6, and SW7 turn off and the switches SW2, SW3, and SW5 turn on. Note that the switches that receive the same control signal operate at substantially the same time in response to the corresponding control signal.

As illustrated in FIG. 2, the differential chopper comparator of this exemplary embodiment receives the control signals ($\Phi 1$, $\Phi 2$, and $\Phi 3$) that are set in the following three states. In this document, the three operations are defined in the following way.

The mode in which the control signals $\Phi 1$ and $\Phi 2$ are H level, and the control signal $\Phi 3$ is L level is referred to as a sample mode (a first mode). Further, the period in the sample mode is referred to as a sample period (a first mode period), and the operation at this time is referred to as a sample operation (a first mode operation).

The mode in which the control signals $\Phi 1$ and $\Phi 2$ are L level and the control signal $\Phi 3$ is H level is referred to as a comparison mode (a second mode). Further, the period in the comparison mode is referred to as a comparison period (a second mode period), and the operation at this time is referred to as a comparison operation (a second mode operation).

The mode in which the control signals $\Phi 1$ and $\Phi 3$ are L level and the control signal $\Phi 2$ shifts from H level to L level is referred to as a transition mode (a third mode). Further, the period in the transition mode is referred to as a transition period (a third mode period), and the operation at this time is referred to as a transition operation (a third mode operation).

The transition mode and the comparison mode are collectively referred to as a hold mode. The period in the hold mode is referred to as a hold period, and the operation at this time is referred to as a hold operation.

The explanation starts from the state when the differential chopper comparator of this exemplary embodiment is in the sample state. In the sample period, the switches SW1, SW4, SW6, and SW7 turn on, and the switches SW2, SW3, and SW5 turn off. At this time, the input signal voltage Vin is applied to one end of the capacitor C1 via the switch SW1. At the same time, the predetermined fixed voltage Vfix is applied to one end of the capacitor C2 via the switch SW4.

When SW6 and SW7 turn on at the same time, the non-inverting input terminal and the inverting output terminal of the differential amplification circuit 5 are shorted, and the inverting input terminal and the non-inverting output terminal of the differential amplification circuit 5 are shorted. Then the input and output voltage of the differential amplification circuit 5 converges to the threshold voltage Vth. Accordingly, the potential of the other end of the capacitor C1 and the other end of the capacitor C2 will be the threshold voltage Vth. Therefore, the electric charge corresponding to a voltage difference (Vin−Vth) between the input signal voltage Vin and the threshold voltage Vth is accumulated in the capacitor C1. On the other hand, the electric charge corresponding to a voltage difference (Vfix−Vth) between the fixed voltage Vfix and the threshold voltage Vth is accumulated in the capacitor C2. The electric charge is accumulated in the capacitors C1 and C2 over the sample period.

Next, only the switches SW1 and SW4 change from on to off, and the mode shifts from the sample mode to the transition mode (the first half of the transition mode). In the first half of the transition mode, the non-inverting input terminal and the inverting output terminal of the differential amplification circuit 5 are shorted, and the inverting input terminal and the non-inverting output terminal of the differential amplification circuit 5 are shorted. Thus the potentials of the other end of the capacitor C1 and the other end of the capacitor C2 (that is, terminals of the capacities C1 and C2 on the side connected to the differential amplification circuit) remain to be the threshold voltage Vth.

If the switch SW1 changes from on to off, the feedthrough (switching noise) is generated from the switch SW1. This is because that the electric charge accumulated in the parasitic capacitance of the NMOS transistor, which is the switch SW1, is discharged when the level of the control signal Φ1 applied to the switch SW1 changes from H to L level. An error voltage Vftha is further applied to one end of the capacitor C1 for the electric charge accumulated in this parasitic capacitance (which is the feedthrough). Similarly, the error voltage Vfthb is further applied to one end of the capacitor C2 by the feedthrough from the switch SW4.

Accordingly, the both ends of the capacitor C1 have a potential of (Vin−Vth+Vftha), and the both ends of the capacitor C2 have a potential of (Vfix−Vth+Vfthb).

Note that in the first half of the transition mode, the switches SW1, SW4, SW6, and SW7 are avoided to turn off at the same time in this way. This is because that by turning off the switches SW1, SW4, SW6, and SW7 at the same time, electric charge by the feedthrough from the switches SW6 and SW7 are injected into the capacitors C1 and C2. As in the present invention, by providing a time difference, the feedthrough can be only from the switches SW1 and SW4.

In the transition mode, after the switches SW1 and SW4 turn off, the switches SW6 and SW7 changes from on to off (in the latter half of the transition mode). This disconnects the short circuit connection between the non-inverting input terminal and the inverting output terminal of the differential amplification circuit 5, and the short circuit connection between the inverting input terminal and the non-inverting output terminal of the differential amplification circuit 5.

Then, the switches SW2, SW3, and SW5 change from off to on, and the mode shifts from the transition mode to the comparison mode. Accordingly, the reference voltage Vref (the first voltage) is applied to one end of the capacitor C1, and the fixed potential Vfix (the second voltage) is applied to one end of the capacitor C2. Therefore, in order to keep constant amount of electric charge accumulated in the capacities C1 and C2, the potential of the other end of the capacitor C1 changes to Vref−(Vin−Vth+Vftha), and the potential of the other end of the capacitor C2 changes to Vfix−(Vfix−Vth+Vfthb)=Vth−Vfthb. Thus, the potential of Vref−(Vin−Vth+Vftha) is applied to the non-inverting input terminal of the differential amplification circuit 5. Further, the potential of Vth−Vfthb is applied to the inverting input terminal of the differential amplification circuit 5. Then, the differential amplification circuit 5 outputs the comparison result therebetween. Suppose that a gain of the differential amplification circuit 5 is G, the inverting output terminal of the differential amplification circuit 5 indicates the following voltage level.

$$-G[Vref - (Vin - Vth + Vftha) - (Vth - Vfthb) =$$
$$-G[Vref - Vin + Vth - Vftha - Vth + Vfthb] =$$
$$-G[Vref - Vin - Vftha + Vfthb]$$

The reason that there is some time before turning on the switches SW2 and SW3 after the switches SW6 and SW7 turn off when shifting from the transition mode (in the latter half of the transition mode) to the comparison mode is explained hereinafter. If the switches SW2 and SW3 turn on and the switches SW6 and SW7 turn off at the same time, there is a transitional state in which both the switches SW2 and SW6 are on. Similarly, in the capacitor C2, there is a state in which both the switches SW3 and SW7 are on. As a result, as for the capacitor C1, the electric charge of the capacitor C1 escapes in the both directions of SW2 and SW6. As for the capacitor C2, the electric charge of the capacitor C2 escapes in the both directions of SW3 and SW7. This reduces the comparison accuracy of the differential amplification circuit 5. Thus, the reason is to avoid the abovementioned situation.

The differential chopper comparator of this exemplary embodiment has the abovementioned circuit configuration. Further, the differential chopper comparator of this exemplary embodiment operates in a way that when shifting from the sample mode to the transition mode, only the switches SW1 and SW4 change from on to off from the state in which the switches SW1, SW4, SW6, and SW7 are on, and the switches SW2, SW3, and SW5 are off (sample state). Accordingly, in the sample state, the impedance of the first unit 100 side viewed from one end of the capacitor C1 is one end of the switch SW2, one end of the switch SW5, and the switch SW1 that turned on. Further, the impedance of the second unit 101 side viewed from one end of the capacitor C2 is one end and the other end of the switch SW3, and the switch SW4 that turned on. In this manner, the circuit is configured symmetrically.

As described above, the electric charge from the parasitic capacitance of the switch SW1 moves through the switch SW1, not only to the capacitor C1, while the switch SW1 completely turns off. The discharge of the electric charge through the switch SW1 depends on the impedance in the direction of the first switch unit 100 from one end of the capacitor C1. The same applies to the switch SW4. By the abovementioned configuration of the differential chopper comparator of this exemplary embodiment, the impedance of the first witch unit 100 side viewed from one end of the capacitor C1 and the impedance of the second switch unit 101 side viewed from one end of the capacitor C2 can be substantially the same. Therefore, it can be considered that Vftha and Vfthb are substantially the same.

Accordingly, Vftha=Vfthb, and the inverting output terminal of the differential amplification circuit 5 indicates the following voltage level.

$$-G[Vref-Vin-Vftha+Vfthb]=-G[Vref-Vin]$$

The differential amplification circuit 5 outputs the result of amplifying the comparison between the reference voltage Vref and the input signal voltage Vin, that is the comparison result between the reference voltage Vref and the input signal voltage Vin with cancelled out feedthrough influence.

It is needless to say that the other end of the capacitor C1 and the other end of the capacitor C2 are connected to the corresponding input terminals of the differential amplification circuit 5, and the corresponding switches (SW6 and SW7), thereby achieving symmetric configuration. The impedances are also substantially the same.

More important, unlike the related art, the differential chopper comparator of this exemplary embodiment receives the fixed voltage Vfix into the capacitor C2 side instead of the reference voltage Vref. As apparent from above, the operation of the differential chopper comparator of this exemplary embodiment does not depend on the fixed voltage Vfix. Thus, the configuration to apply the reference voltage Vref and the fixed potential Vfix achieves the symmetric configuration for the input sides of the capacitors C1 and C2.

Further, the differential chopper comparator of this exemplary embodiment receives the control signals (Φ1, Φ2, and Φ3). The reason that the three control signals are supplied is purposed for the abovementioned exemplary advantage.

Figure 5:
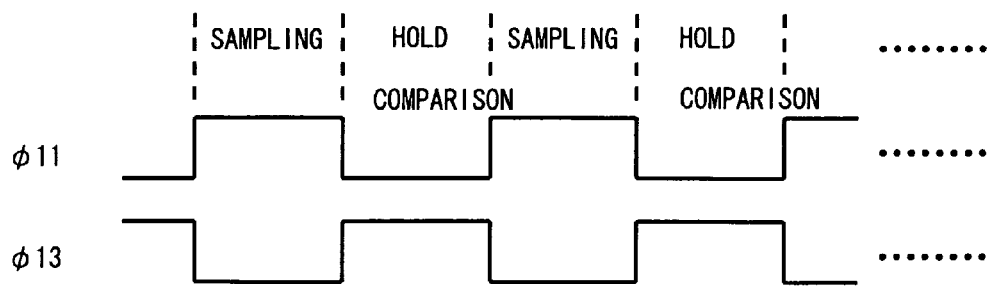
FIG. 5 is a waveform chart of control signals for controlling each switch of the differential chopper comparator according to the related art.
Figure 6:
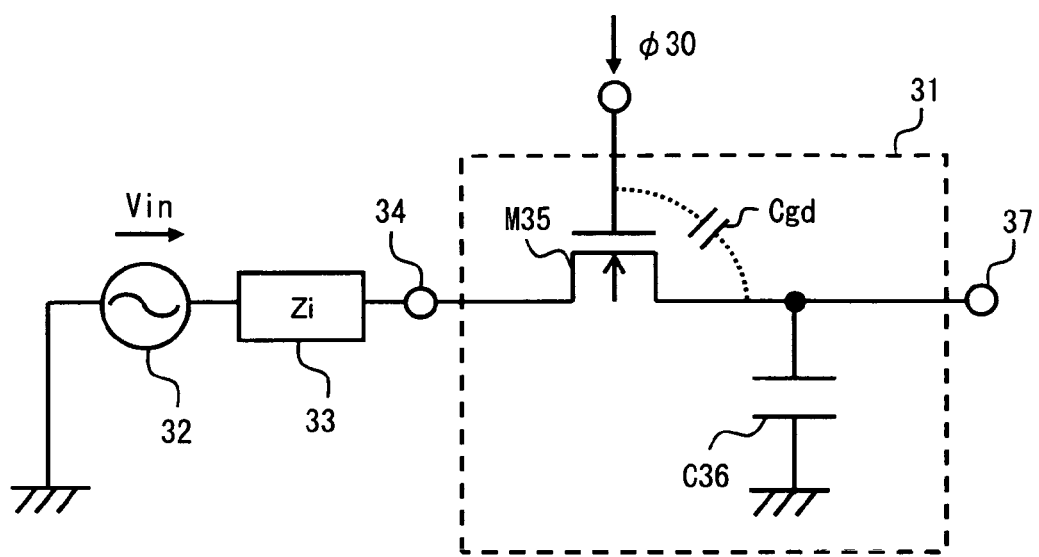
FIG. 6 explains the problem in the related art.

If the above exemplary advantage can be ignored, two control signals (for example Φ1 and Φ2) may be used for operation in a similar way as the related art. In such case, the switches SW2, SW3, and SW5 may receive the control signal Φ2 instead of the control signal Φ3. Further, if two control signals are used for operation, the control signals Φ11 and Φ13 may be supplied, as the ones illustrated in FIG. 5. In either case, certain exemplary advantage can be expected by achieving the symmetric property of the circuit (the input sides viewed from the capacitors C1 and C2 are symmetric configuration).

Instead of the configuration of the differential chopper comparator of this exemplary embodiment illustrated in FIG. 1, the non-inverting input terminal of the differential amplification circuit 5 may be connected to the other end of the capacitor C2, and the inverting input terminal may be connected to the other end of the capacitor C1. That is, the configuration can be other form as long as either the non-inverting input terminal or the inverting input terminal of the differential amplification circuit 5 is connected to the other end of the capacitor C1, and the remaining one of the non-inverting input terminal and the inverting input terminal is connected to the other end of the capacitor C2.

In addition to the abovementioned circuit configuration, the symmetric property of the circuit can further be improved by considering over the circuit layout.

Specifically, the transistor size and characteristics of the switches SW1 and SW4 are configured to be the same. The same characteristics indicate that the resistance components varied by a temperature change are the same. This further means that the resistance components varied by a change in voltage and current are the same. Similarly, the transistor size and characteristics of the switches SW2, SW3, and SW5 are configured to be the same. The transistor size and characteristics of the switches SW6 and W7 are configured to be the same. The capacitance values of the capacitors C1 and C2 are configured to be the same.

Further, the length of the wire connecting between the switch SW1 and the capacitor C1 and the length of the wire connecting between the switch SW4 and the capacitor C2 are configured to be the same. The length of the wire connecting between the switch SW2 and the capacitor C1 and the length of the wire connecting between the switch SW3 and the capacitor C2 are configured to be the same. The length of the wire connecting between the capacitor C1 and the positive phase input terminal of the differential amplification circuit 5 and the length of the wire connecting between the capacitor C2 and the negative phase input terminal of the differential amplification circuit 5 are configured to be the same. The length of the wire connecting between the switch SW1 and the input terminal I1 and the length of the wire connecting between the switch SW4 and the input terminal I3 are configured to be the same. The length of the wire connecting between the switch SW1 and the switch SW5 and the length of the wire connecting between the switch SW4 and the switch SW3 are configured to be the same. The length of the wire connecting between one end of the switch SW6 and the positive phase input terminal of the differential amplification circuit 5 and the length of the wire connecting between one end of the switch SW7 and the negative phase input terminal of the differential amplification circuit 5 are configured to be the same. The length of the wire connecting between the other end of the switch SW6 and the negative phase input terminal of the differential amplification circuit 5 and the length of the wire connecting between the other end of the switch SW7 and the positive phase input terminal of the differential amplification circuit 5 are configured to be the same.

In other words, by configuring each element composing the circuit and wires between the elements to be physically (length and shape, for example) the same when configuring the differential chopper comparator of this exemplary embodiment, the symmetric property of the circuit can further be improved. This enables to equalize the impedance of the capacitors C1 and C2 and cancel out the amount of feedthrough, thereby achieving a comparator with higher accuracy.

Figure 3:
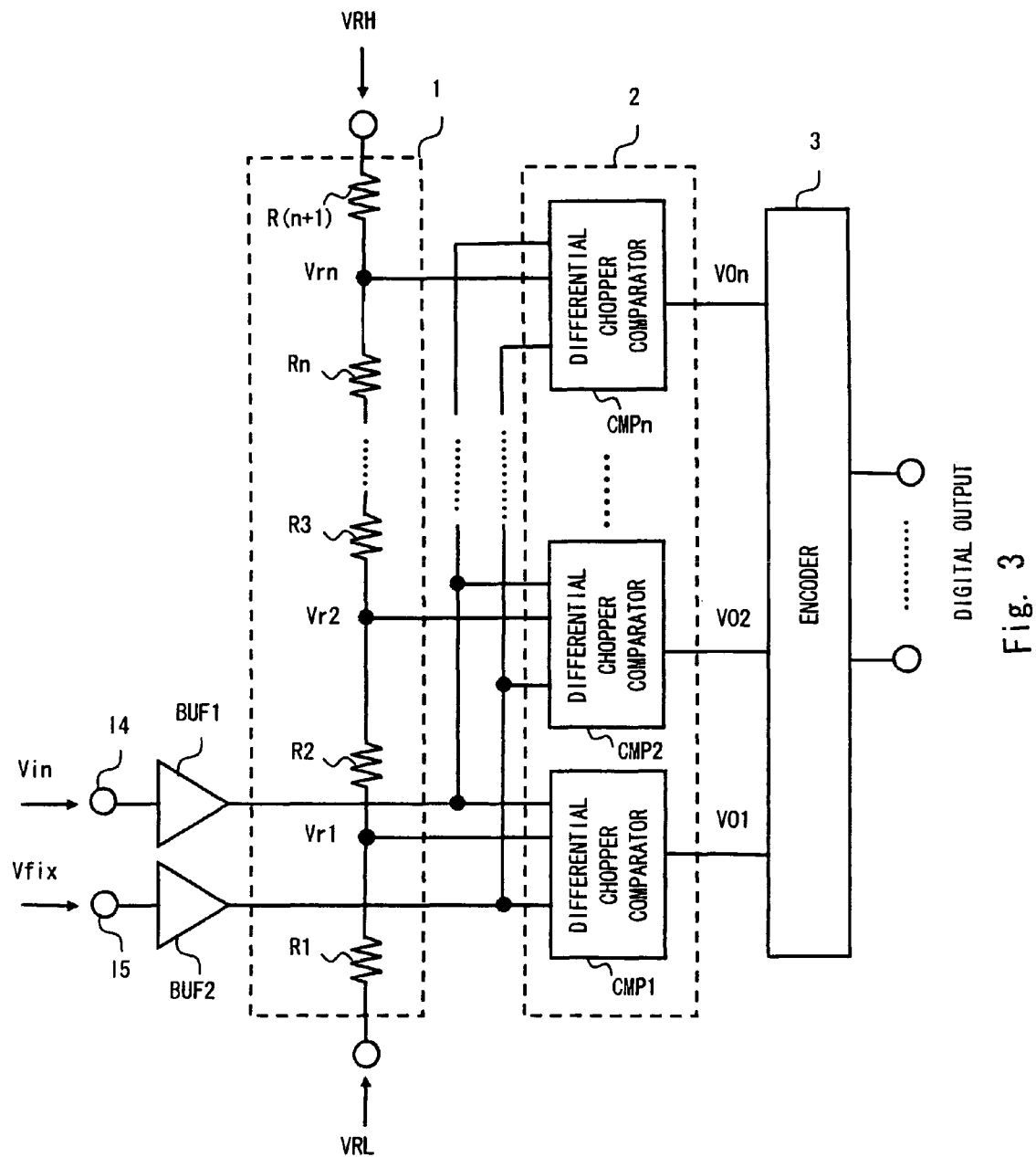
FIG. 3 is a circuit diagram of an A/D converter according to the exemplary embodiment of the present invention.

Next, an application of the differential chopper comparator of the present invention is described. FIG. 3 illustrates an A/D converter (ADC) according to this exemplary embodiment. The A/D converter illustrated in FIG. 3 includes multiple differential chopper comparators of FIG. 1. The A/D converter illustrated in FIG. 3 is composed of buffers BUF1 and BUF2, a reference voltage generation circuit 1, a comparator group 2, and an encoder 3. The comparator group 2 is composed of n (n is an natural number) number of differential chopper comparators CMP1 to CMP(n) illustrated in FIG. 1. The reference voltage generation circuit 1 is provided with n+1 number of resistance elements R1 to R(n+1). The reference voltage generation circuit 1 further includes a fourth and a fifth terminals. A high potential power supply (a fourth voltage) VRH is applied to a third terminal. A low voltage power supply (a fifth voltage) VRL is applied to the fourth terminal. Then, the resistance elements R1 to R(n+1) are connected in series between the high potential power supply VRH and the low voltage power supply VRL.

Further, n number of node potentials Vr1 to Vr(n) between each resistance element are input to the input terminals I2 of the corresponding differential chopper comparators CMP1 to CMP(n) as the reference voltage. The voltage Vin of the input signal is input to the input terminals I1 of each differential chopper comparators CMP1 to CMP(n) via an external input terminal I4 and BUF1 (this electrical path is referred to as a first path). Further, the fixed voltage Vfix is input to the input terminals I3 of each differential chopper comparators CMP1 to CMP(n) via an external input terminal I5 and BUF2 (this electrical path is referred to as a second path). The output signals (determination result) of the differential chopper comparators CMP1 to CMP(n) are input to the encoder 3. The encoder 103 outputs a digital signal according to the determination result of each differential chopper comparator.

Note that the transistor configuration and size of the buffers BUF1 and BUF2 are the same. Further, in each of the differential chopper comparators CMP1 to CMP(n), the length of the wire from the input terminal I1 to the output terminal of the buffer BUF1 and the length of the wire from the input terminal I3 of the corresponding differential chopper comparator to the output terminal of the buffer BUF2 are the same. That is, there are the first path for distributing the input signal voltage (Vin) to the first switch units 100 of each differential chopper comparator, and the second path for distributing the second voltage (Vfix) to the second switch units 101 of each differential chopper comparator. The length of the first and the second paths are at least the same. Accordingly, in each differential chopper comparator, the impedance value assuming the input terminal I4 (hereinafter referred to as an analog voltage input side) of the A/D converter from the input terminal I1, and the impedance value assuming the input terminal I5 (hereinafter referred to as a reference voltage input side) of the A/D converter from the input terminal I2 are the same. That is, the amount of generated feedthrough in the analog voltage input side (SW1) and the amount of generated feedthrough in the reference voltage input side (SW4) are the same. Therefore, the A/D converter of this exemplary embodiment can output highly accurate digital signals according to the highly accurate comparison result by the differential chopper comparator.

It is needless to say that for the first and the second paths, it is better if other physical constants (for example, wire width, and wiring layer and thickness for LSI) are configured to be the same, in addition to the length of the wire. In FIG. 3, the buffers BUF1 and BUF2 may be added as necessary, and they may or may not be added.

Figure 4:
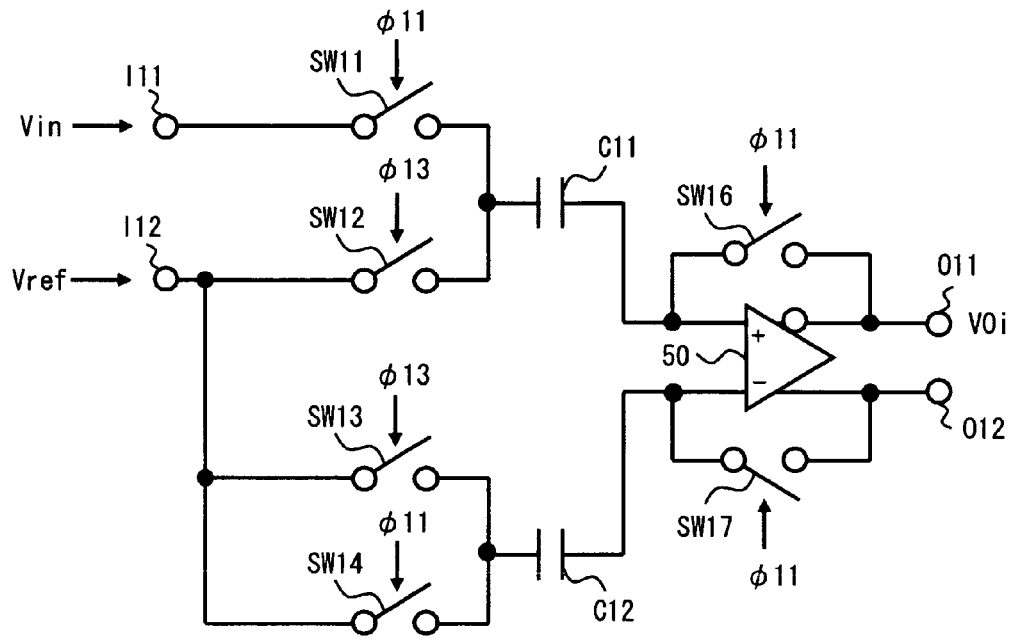
FIG. 4 is a circuit diagram of a differential chopper comparator according to a related art.
Figure 7:
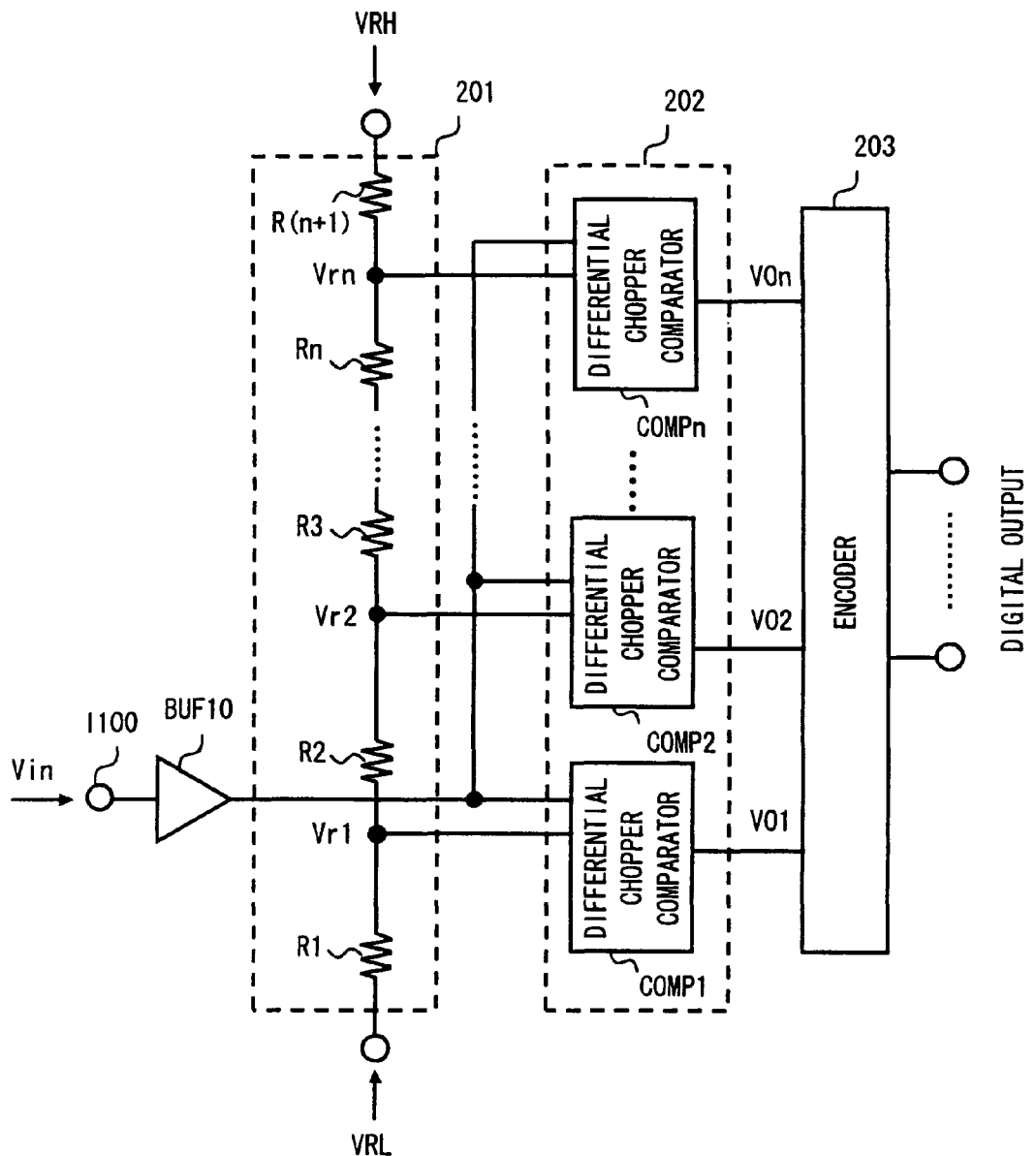
FIG. 7 illustrates the problem in the A/D converter using the differential chopper comparator according to the related art.

On the other hand, an A/D converter provided with the differential chopper comparator (circuit illustrated in FIG. 4) of the related art is considered hereinafter. FIG. 7 illustrates the problem when configuring the A/D converter using the differential chopper comparator of the related art. The details of the circuit are almost the same as the A/D converter (circuit illustrated in FIG. 3) provided with the above-mentioned differential chopper comparator of FIG. 1 according to the present invention. However the n number of node potentials Vr1 to Vr(n) between each resistance element of a reference voltage generation circuit 201 are input to the input terminals I12 of the corresponding differential chopper comparators COMP1 to COMP(n).

Accordingly, the impedance viewed from the input terminal I11 (terminal for receiving analog voltage) of the differential chopper comparator COMP1 is made of the output impedance of BUF10 and the impedance calculated by a parallel connection of each input terminal I11 of the differential chopper comparators COMP2 to COMP(n). Further, the impedance viewed from the input terminal I12 (a terminal for receiving the reference voltage) of the differential chopper comparator COMP1 is made of the impedance of the corresponding node Vr1. That is, the impedance values are different between the analog voltage input side (the input terminal I11) and the reference voltage input side (the input terminal I12) of the differential chopper comparator COMP1. Furthermore, as there are multiple differential chopper comparators connected, the difference is far greater than the single differential chopper comparator. The same applies to each of the differential chopper comparators COMP2 to COMP(n). Then, in the circuit illustrated in FIG. 4, the amount of generated feedthrough is different between the analog voltage input side (SW11) and the reference voltage side (SW14), thus it is difficult to cancel out the feedthrough.

As described above, the differential chopper comparator of this exemplary embodiment and the A/D converter including the same enable to have the same amount of feedthrough provided to the capacitors C1 and C2 by equalizing the impedance values viewed from the capacitors C1 and C2. Thus, the differential chopper comparator of this exemplary embodiment and the A/D converter including the same can output a highly accurate comparison result.

The present invention is not limited to the above exemplary embodiment, but may be modified as appropriate within the scope of the present invention.

Moreover, the above exemplary embodiment explained the case of including the switches SW1 to SW7 that turn on when the control signal is H level and turn off when the control signal is L level, however it is not limited to this. The circuit configuration may be changed to include the switches SW1 to SW7 that turn on when the control signal is L level and turn off when the control signal is H level.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A differential chopper comparator for comparing an input signal voltage and a first voltage comprising:
   a first capacitor;
   a second capacitor; and
   a differential amplification unit including a differential amplification circuit, wherein
   one of the input signal voltage and the first voltage is applied to one end of the first capacitor via a first switch unit,
   a second voltage is applied to one end of the second capacitor via a second switch unit,
   one of a non-inverting input terminal and an inverting input terminal of the differential amplification circuit is connected to the other end of the first capacitor, and the other one of the non-inverting input terminal and the inverting input terminal is connected to the other end of the second capacitor, and
   an impedance of the first switch unit side viewed from the one end of the first capacitor and an impedance of the second switch unit side viewed from the one end of the second capacitor are substantially same.

2. The differential chopper comparator according to claim 1, wherein
   the first switch unit comprises:
      a first switch that is provided between a first terminal and the one end of the first capacitor, the first terminal being applied with the input signal voltage;
      a second switch that is provided between a second terminal and the one end of the first capacitor, the second terminal being applied with the first voltage; and
      a replica element including one end connected to the first terminal,
   the second switch unit comprises:
      a third switch that is provided between a third terminal and the one end of the second capacitor, the third terminal being applied with the second voltage; and
      a fourth switch provided in parallel with the third switch, and the first to the fourth switches are controlled to turn on and off by a control signal.

3. The differential chopper comparator according to claim 2, wherein the replica element is a fifth switch including a same structure as the third switch.

4. The differential chopper comparator according to claim 3, wherein
the differential amplification unit comprises:
a sixth switch provided between a non-inverting input terminal and an inverting output terminal of the differential amplification circuit; and
a seventh switch provided between an inverting input terminal and a non-inverting output terminal of the differential amplification circuit, and
the sixth and the seventh switches are controlled to turn on and off by the control signal.

5. The differential chopper comparator according to claim 4, wherein
in a first mode, the first, the fourth, the sixth, and the seventh switches turn on, and the second, the third, and the fifth switches turn off, and
in a second mode, the first, the fourth, the sixth, and the seventh switches turn off, and the second, the third, and the fifth switches turn on.

6. The differential chopper comparator according to claim 5, wherein in case of shifting from the first mode to the second mode, after the first and the fourth switches switch from on to off, the sixth and the seventh switches switch from on to off.

7. The differential chopper comparator according to claim 4, wherein
the control signal is composed of a first and a second control signals,
the first, the fourth, the sixth, and the seventh switches are controlled to turn on and off by the first control signal, and
the second, the third, and the fifth switches are controlled to turn on and off by the second control signal.

8. The differential chopper comparator according to claim 4, wherein
the control signal is composed of a first, a second, and a third control signals,
the first and the fourth switches are controlled to turn on and off by the first control signal,
the second, the third, and the fifth switches are controlled to turn on and off by the second control signal, and
the sixth and the seventh switches are controlled to turn on and off by the third control signal.

9. The differential chopper comparator according to claim 7, further comprising a control circuit that outputs the first and the second control signals so that
in the first mode, the first, the fourth, the sixth, and the seventh switches turn on, and the second, the third, and the fifth switch turn off, and
in the second mode, the first, the fourth, the sixth, and the seventh switches turn off, and the second, the third, and the fifth switches turn on.

10. The differential chopper comparator according to claim 8, further comprising a control circuit that outputs the first, the second, and the third control signals so that
in the first mode, the first, the fourth, the sixth, and the seventh switches turn on, and the second, the third, and the fifth switch turn off, and
in the second mode, the first, the fourth, the sixth, and the seventh switches turn off, and the second, the third, and the fifth switches turn on,
wherein in case of shifting from the first mode to the second mode, after the first and the fourth switches switch from on to off, the differential chopper comparator outputs the first, the second, and the third control signals in order to switch the sixth and the seventh switches from on to off.

11. The differential chopper comparator according to claim 4, wherein
the first and the fourth switches have a same characteristic,
the second, the third, and the fifth switches have a same characteristic, and
the sixth and the seventh switches have a same characteristic.

12. The differential chopper comparator according to claim 3, wherein
a length of a wire connecting between the first switch and the first capacitor and a length of a wire connecting between the fourth switch and the second capacitor are same,
a length of a wire connecting between the second switch and the first capacitor and a length of a wire connecting between the third switch and the second capacitor are same,
a length of a wire connecting between the first capacitor and the differential amplification circuit and a length of a wire connecting between the second capacitor and the differential amplification circuit are same,
a length of a wire connecting between the first switch and the first terminal and a length of a wire connecting between the fourth switch and the third terminal are same, and
a length of a wire connecting between the first switch and the fifth switch and a length of a wire connecting between the fourth switch and the third switch are same.

13. The differential chopper comparator according to claim 4, wherein
a length of a wire connecting between one end of the sixth switch and the differential amplification circuit and a length of a wire connecting between one end of the seventh switch and the differential amplification circuit are same, and
a length of a wire connecting between the other end of the sixth switch and the differential amplification circuit and a length of a wire connecting between the other end of the seventh switch and the differential amplification circuit are same.

14. The differential chopper comparator according to claim 1, wherein the first and the second voltages are applied to keep separation to an extent not to electrically influence each other.

15. An A/D converter comprising a plurality of the differential chopper comparator according to claim 1.

16. The A/D converter according to claim 15, further comprising:
a first path that distributes the input signal voltage to the first switch unit of each of the differential chopper comparators; and
a second path that distributes the second voltage to the second switch unit of each of the differential chopper comparators,
wherein wires that form the first and the second paths have at least a same length.

17. The A/D converter according to claim 15, further comprising:
a fourth terminal that is applied with a third voltage;
a fifth terminal that is applied with a fourth voltage; and
a plurality of resistance elements that are connected in series between the fourth terminal and the fifth terminal,
wherein voltages of connection points between the plurality of resistance elements are respectively applied to the first switch units of the differential chopper comparators as the first voltages.

* * * * *